United States Patent [19]

Curti

[11] Patent Number: 4,540,084

[45] Date of Patent: Sep. 10, 1985

[54] DEVICE FOR AUTOMATICALLY TRANSFERRING PRINTED CIRCUIT BASE PLATES FROM THE LOADING TO THE PRINTING ZONE

[76] Inventor: Ezio Curti, Viale Regina Giovanna, 38, 20100 Milan, Italy

[21] Appl. No.: 476,516

[22] Filed: Mar. 18, 1983

Related U.S. Application Data

[63] Continuation-in-part of Ser. No. 357,214, Mar. 11, 1982, abandoned.

[30] Foreign Application Priority Data

Nov. 9, 1981 [IT] Italy .............................. 24923 A/81

[51] Int. Cl.³ ............................................. B65G 25/02
[52] U.S. Cl. .................. 198/468.3; 101/126; 198/463.2; 198/621; 271/268
[58] Field of Search ........................ 198/486, 488, 621; 414/751-753; 101/126; 271/85, 232, 247, 268

[56] References Cited

U.S. PATENT DOCUMENTS 4,015,702  4/1977  Bergling .......................... 271/268 X
4,297,927  11/1981  Kuroda ............................ 414/753 X Primary Examiner—Jeffrey V. Nase
Attorney, Agent, or Firm—Roylance, Abrams, Berdo & Goodman

[57] ABSTRACT

An apparatus automatically transfers printed circuit base plates from a loading to a printing zone by using pliers elements for gripping the base plate arranged in the loading zone, removing it from the reference dowels and transferring it automatically to the printing zone where the base plate is automatically positioned on reference dowels. The plier elements return to their initial position for gripping a new base plate loaded in the meantime.

15 Claims, 8 Drawing Figures

DEVICE FOR AUTOMATICALLY TRANSFERRING PRINTED CIRCUIT BASE PLATES FROM THE LOADING TO THE PRINTING ZONE

CROSS-REFERECE TO RELATED APPLICATION

This application is a continuation-in-part of U.S. patent application Ser. No. 357,214, filed Mar. 11, 1982 and entitled "Automatic Supporting Plate Loader", now abandoned.

FIELD OF THE INVENTION

This invention relates to an apparatus for automatically transferring printed circuit base plates from a loading to a printing zone.

BACKGROUND OF THE INVENTION

For transferring printed circuit base plates, it is already known to use a trolley having a loading table with reference dowels for receiving the plates to be printed, complete with suitable reference holes. In the known form of construction, the trolley, after receiving a plate to be printed, is moved from the loading zone to the printing zone where, with a considerable waste of adjustment, control and checking means, the trolley is located so that the base plate being printed is below the printing unit, in general a silk-screen printing device.

After the completion of the printing phase, the trolley returns to the loading unit where the printed plate is removed with known means from the reference dowels. A new base plate can then be loaded and forwarded to the printing zone.

The known trolley device is disadvantageous in that moving the trolley from the loading position to the printing position requires accurate positioning of the plate and wastes considerable mechanical and electrical energy. In addition, displacement of the entire trolley with the loaded plate below the printing unit does not permit high speed operation or high performance because to load a new plate it is necessary to first complete the entire printing operation, return the trolley to the initial position, and detach the printed plate from the plane provided with the reference dowels. A further disadvantage of the known trolly is its reduced accuracy relative to the positioning of the plate below the printing unit. This accuracy should approach hundredths of a millimeter. Moreover, the repeatability of positioning is not guaranteed with the conventional trolley.

SUMMARY OF THE INVENTION

An object of the present invention is to obviate the disadvantages of the conventional trolley by means of a loading device which is easier to construct and permits the base plate to be positioned with the maximum accuracy and perfect repeatability underneath the printing unit.

Another object of the present invention is to produce an apparatus which considerably increases the output by loading and positioning a base plate in the loading station, while the preceding base plate is still undergoing the printing operation.

These objects are attained according to the present invention by a sole fixed plane divided into a loading zone and a printing zone and equipped with controllable pliers-like gripping elements movable horizontally across the plane and vertically relative to the plane. With the present invention unprinted base plates can be loaded and prepositioned in the loading zone using fixed reference dowels, picked up with the pliers-like grippers, removed from the reference dowels, conveyed to the printing zone, and positioned on the reference dowels in the printing zone. Then the pliers-like grippers release the base plates, are lowered below the fixed plane, and are returned to the loading zone. In the meantime, a new plate has been loaded and prelocated in the loading zone, which base plate is now gripped and transferred to the printing zone.

Other objects, advantages and salient features of the present invention will become apparent from the following detailed description, which, taken in conjunction with the annexed drawings, discloses a preferred embodiment of the present invention.

BRIEF DESCRIPTION OF THE DRAWINGS

Referring to the drawings which form a part of this disclosure.

DETAILED DESCRIPTION OF PREFERRED EMBODIMENT

Figure 1:
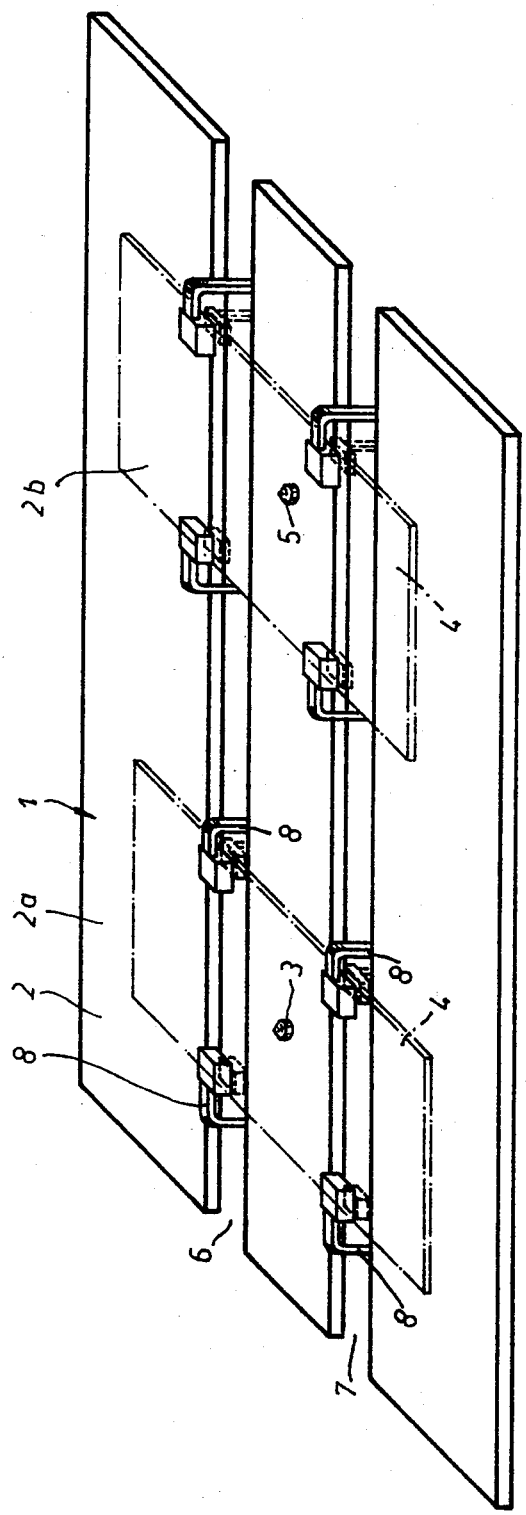
FIG. 1 is a schematic, perspective view of an apparatus according to the present invention with a support divided into a loading zone and a printing zone.

As shown in FIG. 1, the printed circuit base plate printing apparatus comprises a single plane 2 divided into a loading zone 2a and a printing zone 2b. Loading zone 2a has known reference dowels 3, at least two dowels permit loading and prepositioning of a base plate.

Printing zone 2b has reference dowels 5. According to conventional practice reference dowels 3, 5 must coincide with reference holes provided at a suitable point in plate 4. For this reason, dowels 3, 5 must be adjustable, for example by window-like openings in the plane 2 or the like, as already known in silk-printing machines. The centers between corresponding dowels (for example dowels 3 and 5) must always be constant.

Plane 2 is cut longitudinally forming longitudinal openings or channels 6 and 7 slidably receiving grippers 8. Advantageously two grippers 8 are interlinked at two parallel sides of base plates 4. Thus, FIG. 1 illustrates a fundamental concept of this invention, that is of a single fixed plane with a preloading zone 2a in which the base plate 4 is loaded and located to be gripped by a pliers-like gripper 8, and transferred to printing zone 2b. In the printing zone the base plate is positioned and automatically regulated (on dowel 5) for the printing process with a known printing unit at a reduced distance above plane 2.

Figure 2:
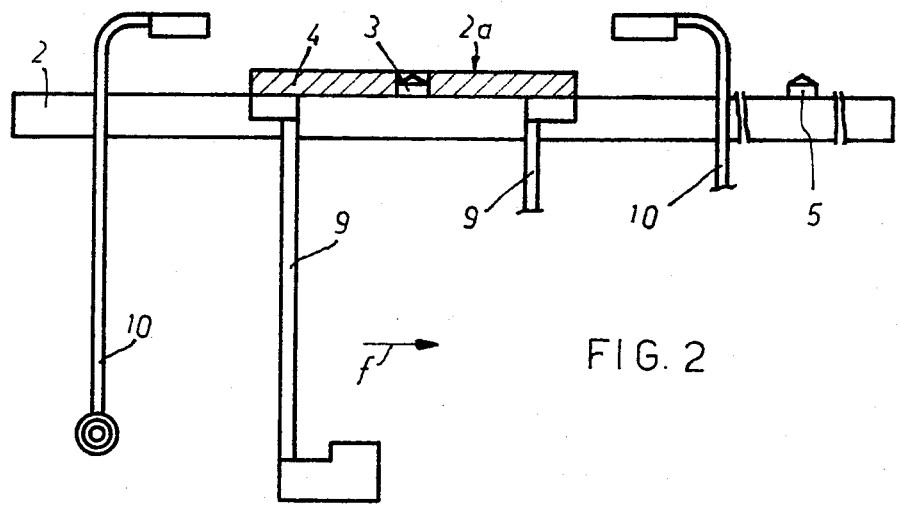
FIGS. 2 to 7 are schematic, side elevational vies of the apparatus of FIG. 1, illustrating the sequence of movements of pliers-like grippers during the base plate loading operation and transfer operation.

The different operations are illustrated in FIGS. 2 to 7. FIG. 2 shows schematically a base plate 4 arranged on reference dowel 3 of loading station 2a. The grippers 8 comprise a fixed support 9 at the lower edge of plate 4 and a relatively movable pliers-like element 10.

FIG. 2 shows plate 4 loaded and preregulated on dowel 3 of loading zone 2a, while dowel 5 of the printing zone is free, that is, without a plate 4.

Figure 3:
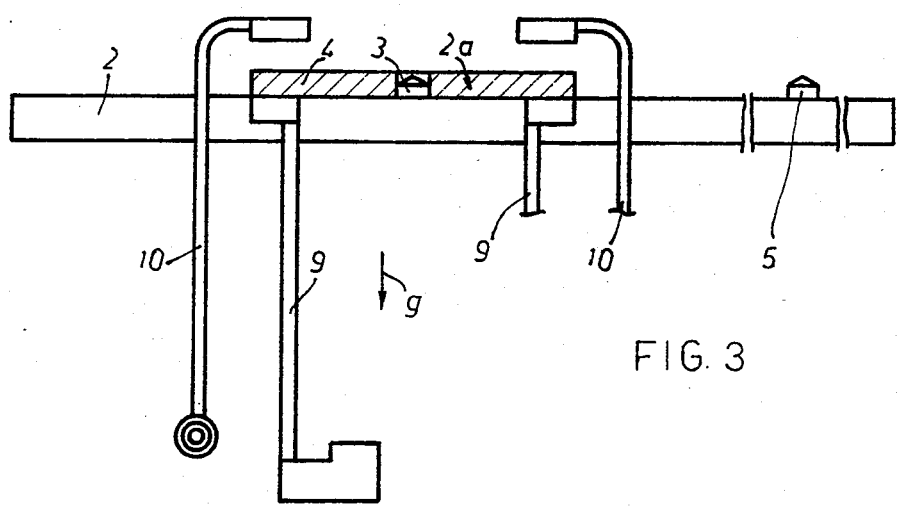
Figure 4:
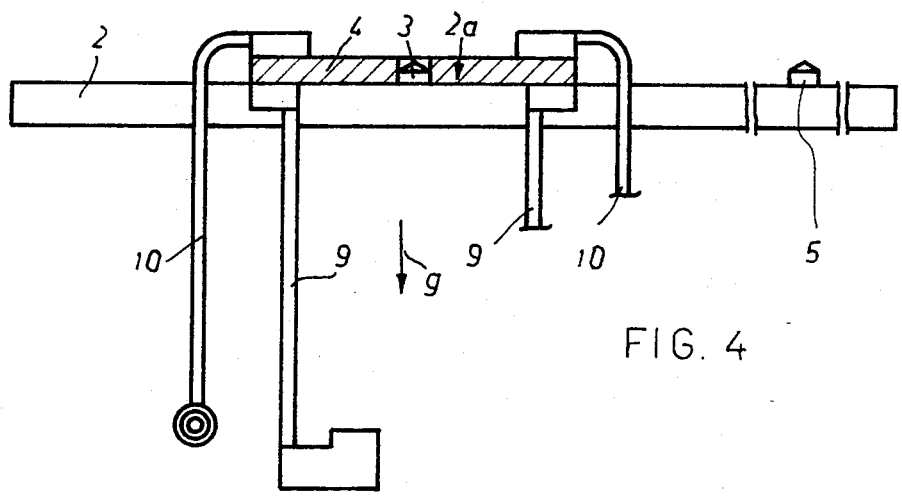
Figure 5:
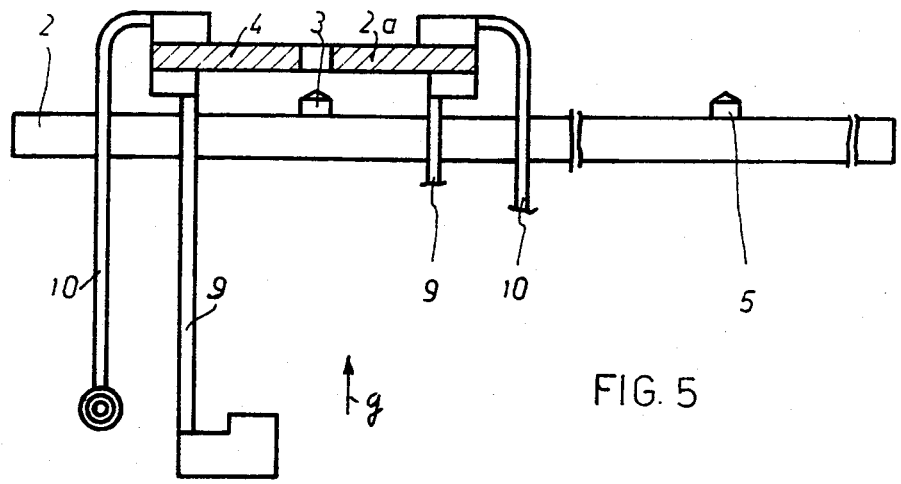
Figure 6:
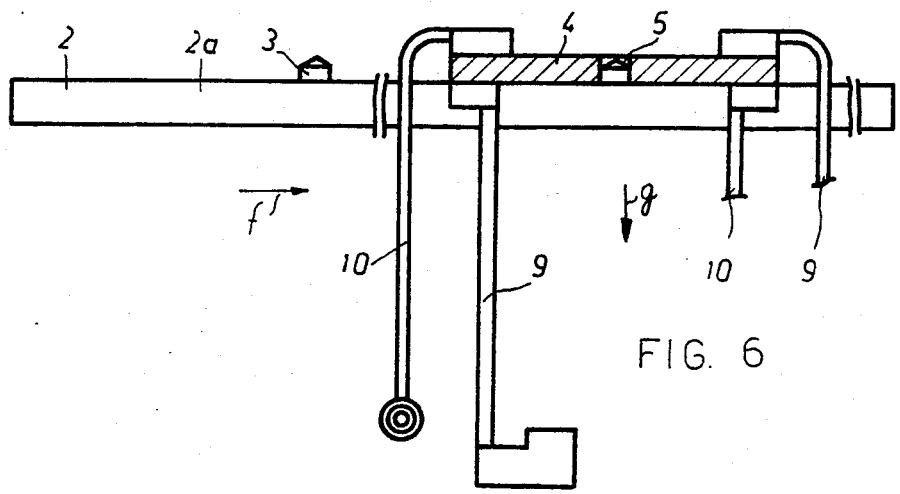

With a mechanism described in detail in connection with FIG. 8, grippers 8 (two for each side of plate 4) approach the edges of plate 4 as shown in FIG. 3 with the movable pliers-like element 10 above the relative edge of plate 4 at the level of the corresponding support element 9. FIG. 4 shows that, after lowering movable element 10, plate 4 is locked between the movable pliers-like elements 10 and the fixed lower support elements 9. When moving all the grippers 8 through open channels 6 and 7 in an upward direction, plate 4 is detached from reference dowel 3 of loading zone 2a as shown in FIG. 5. When moving all the grippers 8 together (in the direction of the arrow F in FIGS. 2 and 6) toward reference dowel 5 in printing zone 2b and then lowering all the grippers 8 at a position in which the reference hole of plate 4 coincides with reference dowel 5, the plate is accurately loaded (in a perfectly regulated manner) in the printing zone 2b. Meantime, a new plate can be loaded at the loading zone 2a and adjusted as required and as shown in FIG. 6.

Figure 7:
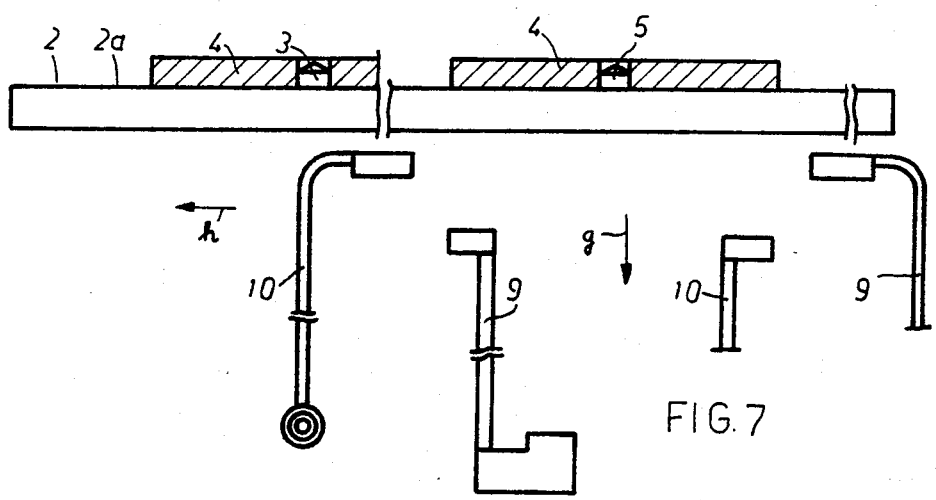

After loading plate 4 in printing zone 2b, grippers 8 are moved in opposition to the operations shown in FIGS. 3 and 2. Thereafter, as shown in FIG. 7, the grippers are engaged and move in the direction of arrow g, through longitudinal openings 6 and 7 to descend below plane 2 and to return freely toward loading station 2a as shown in FIG. 7 and indicated by the arrow h.

This cycle is repeated, beginning with the positioning illustrated in FIG. 2.

Figure 8:
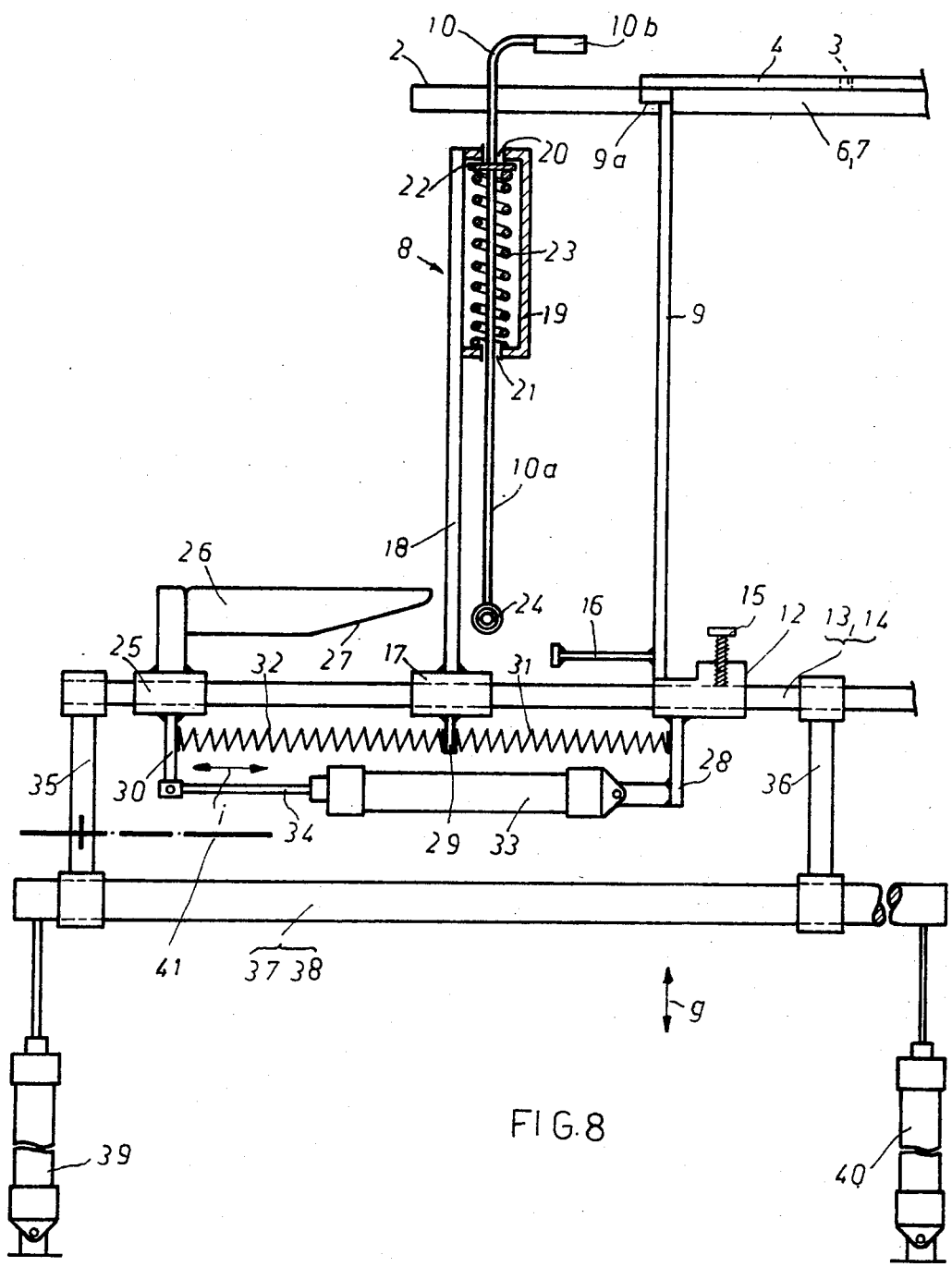
FIG. 8 is a schematic, side elevational view of a gripper complete with the various driving and guiding means according to the present invention.

The described movements of the grippers 8 are made possible by a mechanism schematically shown in FIG. 8, which is common to all the pliers-like grippers 8. For clarity and simplicity, only one mechanism is shown in the drawing, although being provided as shown in FIG. 1 twice at each parallel side of a plate 4. The grippers 8 are guided by suitable rails. As shown in FIG. 8, the gripper 8 comprises a column support 9 whose upper end 9a is at the level of plane 2 inside longitudinal opening 6 or 7 for receiving the plate 4. At the bottom, support 9 is fixed to a first sleeve 12 slidingly mounted on a guide member 13 or 14, guide member 14 being parallel to guide member 13. Sleeve 12 has a regulation screw 15 to adjust the position of gripper 8, in particular the position of the support 9 relative to the edges of plate 4. In addition, support 9 has, at the side facing movable pliers element 10, a stop 16.

The guide members 13 and 14 support with a second sliding sleeve 17, an upright 18 provided at the top with a small body 19. Body 19 has a sliding hole 20 at the top and a sliding hole 21 at the bottom. In holes 20 and 21 slides a rod-like extension 10a of the pliers-like element 10. At upper guidance holes 20, rod 10a is integrally fixed to a plate 22 receiving a pressure spring 23 whose lower end rests on the bottom of body 19 near lower sliding hole 21. Rod element 10a has at its lower end a sliding roller 24. At the top, the pliers-like element 10 is provided with a thickening 10b for locking the plate 4.

FIG. 8 shows that guides 13 and 14 receive a third sliding sleeve 25 supporting a horizontal arm 26 extending toward roller 24 and having at its bottom side an inclined plane 27. Sleeve 12, sleeve 17 and sleeve 25 have downwardly projecting small arms 28, 29 and 30, respectively. A pressure spring 31 is provided between arms 28 and 29, and a pressure spring 32 is provided between arms 29 and 30. The characteristics of spring 31 are chosen so that the force of spring 31 is less than the force of spring 32. In addition, a hydraulic or pneumatic piston 33 is provided between the arms 28 and 30, with the end of piston 33 being fixedly by coupled to arm 28 and the piston rod 34 being fixedly coupled to arm 30.

Guides 13 and 14 are supported by a frame schematically shown with the two uprights 35 and 36. Frame 35, 36 is slidingly supported by lower parallel guides 37 and 38, approximately running along the whole length of plane 1 of the machine. The ends of the guides 37 and 38 are operatively connected with lever systems or, as shown in FIG. 8, with driving pistons 39 and 40 for raising or lowering grippers 8 in direction of arrow g.

The frame 35 and 36 is operatively connected with chain means 41 or the like for displacing frame 35 and 36 on the guide members 37 and 38. The driving mechanism linked to chain 41 must work with maximum accuracy for positioning the gripper 8 repeatedly and exactly at the desired point. Chain driving means 41 is connected to a controllable motor, and may be replaced by other equivalent means.

While FIG. 8 shows only one gripper 8, the other side of plate 4 is equipped with equivalent grippers 8. Each gripper 8 functions as follows: After adjustment of support 9 with regulating screw 15, that is, after the adjustment of the whole gripper mechanism 8 with respect to plate 4, pliers-like element 10 approaches the corresponding edge of plate 4. Piston 33 is engaged for moving the rod in the direction of the arrow i. Since spring 31 is weaker than spring 32, element 10 will be moved toward the panel 4 until stopped by stopping means 16. The piston 33 is still driven by the fluid under pressure such that projecting arm 26 will then move with inclined plane 27 toward and against roller 24, thereby displacing pliers-like element 10, 10a, 10b located over the plate against the pressure of spring 23 in a downward direction, locking the plate 4 on parallel edges.

Thereafter, pistons 39 and 40 are engaged lifting all the grippers 8 and detaching plate 4 from reference dowel 3 in loading station 2a.

Chain mechanism 41 will then be engaged for displacing all the grippers 8 locking panel 4 from loading zone 2a to printing zone 2b. By reversing the action of the pistons 39 and 40, all the grippers 8 are again lowered to precisely locate panel 4 onto the reference dowel(s) 5 of printing station 2b.

After plate 4 is positioned in printing zone 2b, the pressure of the piston 33 is released so that spring 32 displaces arm 26 first and returns it to its original position, freeing roller 24 and causing spring 23 to move element 10, 10a, 10b upward disengaging plates 4. Immediately thereafter, spring 31 displaces sleeve 17 with support 18 and pliers-like arm 10 back to its original position relative to support 9, thereby freeing plate 4. Successively, pistons 39, 40 are reversed so that all grippers 8 descend below plane 2 and are returned by chain 41 to their original position. Another plate 4 is loaded in the meantime in loading zone 2a.

By engaging again pistons 39 and 40, supports 9 are raised to the level of plane 2, and the locking and loading cycle schematically shown hereinbefore in FIGS. 2 to 7, can be repeated.

The apparatus according to the present invention, due to its constructional simplicity, is easily adapted to various sizes of base plates to be used. In addition, a structure can be completely located below the support plane to maximize use of the production capacity offered by the printing unit.

While a particular embodiment has been chosen to illustrate the invention, it will be understood by those skilled in the art that various changes and modifications can be made therein without departing from the scope of the invention as defined in the appended claims.

What is claimed is:

1. An apparatus for automatically transferring printed circuit base plates from a loading zone to a printing zone, comprising:
   a horizontal support plane divided into a loading zone and a printing zone;
   guide means extending parallel to said plane; and
   plier gripper means, movably mounted on said guide means, for gripping a base plate and for moving the base plate horizontally across said plane and vertically relative to said plane, said gripper means including
       a first column support having a relatively fixed first griping element at an upper end thereof and a first sliding sleeve at a lower end thereof,
       a second column support having a relatively movable second gripping element at an upper end thereof and a second sliding sleeve at a lower end thereof, and
       a projecting arm with an inclined plane supported by a third sliding sleeve,
   said sliding sleeves being slidably coupled to said guide means.

2. An apparatus according to claim 1 wherein said first sliding sleeve comprises an adjusting and locking screw.

3. An apparatus according to claim 1 wherein said first column support comprises a stop means, on a side thereof facing said second column support, for engaging said second column support.

4. An apparatus according to claim 1 wherein said second element is coupled to said second column support by a body, said body having top and bottom guide openings and having a spring biasing said second element upwardly.

5. An apparatus according to claim 1 wherein said second element has a roller on a lower end thereof for engaging said inclined plane of said projecting arm to move said second element.

6. An apparatus according to claim 1 wherein said first, second and third sliding sleeves comprise first, second and third laterally projecting arms, respectively; a first spring is coupled to and extends between said first and second arms; and a second spring is coupled to and extends between said second and third arms, said first spring being weaker than said second spring.

7. An apparatus according to claim 1 wherein said first and third sliding sleeves comprise laterally projecting arms, said laterally projecting arms being coupled to opposite ends of a cylinder-piston drive unit.

8. An apparatus according to claim 1 wherein said guide means comprises first and second parallel guide members, said first, second and third sliding sleeves are coupled to said first guide member, said first guide member being slidably coupled to said second guide member by a frame.

9. An apparatus according to claim 8 wherein said second guide member is coupled to lifting means for raising and lowering said gripper means.

10. An apparatus according to claim 9 wherein said lifting means comprises at least one cylinder-piston unit.

11. An apparatus according to claim 8 wherein said frame is coupled to a driving and displacing means for moving said gripper means horizontally.

12. An apparatus according to claim 11 wherein said driving and displacing means comprises a chain.

13. An apparatus according to claim 1 wherein said support plane comprises a base plate, said base plate having reference dowels.

14. An apparatus according to claim 1 wherein said loading and printing zones of said support plane is longitudinally divided by at least two parallel cuts permitting free movement of a plurality of coacting sets of said gripper elements through and along said cuts.

15. An apparatus according to claim 14 wherein said gripper means comprises first and second pairs of coacting sets of said gripper elements, said first pair being interlinked and arranged to engage a first edge of a base plate, said second pair being interlinked and arranged to engage a second edge of the base plate parallel to the first edge.

* * * * *